(12) United States Patent
Benfold (10) Patent No.: US 12,313,706 B2
(45) Date of Patent: May 27, 2025

(54) MAGNETIC SENSOR CALIBRATION USING VIO SYSTEM

(71) Applicant: NIANTIC, INC., San Francisco, CA (US)

(72) Inventor: Ben Benfold, Oxford (GB)

(73) Assignee: Niantic, Inc., San Francisco, CA (US)

( * ) Notice: Subject to any disclaimer, the term of this patent is extended or adjusted under 35 U.S.C. 154(b) by 68 days.

(21) Appl. No.: 18/297,164

(22) Filed: Apr. 7, 2023

(65) Prior Publication Data
US 2024/0337709 A1 Oct. 10, 2024

(51) Int. Cl.
*G01R 33/00* (2006.01)
*G01C 17/38* (2006.01)

(52) U.S. Cl.
CPC ......... *G01R 33/0035* (2013.01); *G01C 17/38* (2013.01)

(58) Field of Classification Search
CPC ............ G01R 33/0035; G01R 33/0017; G01R 33/02; G01R 33/0206; G01R 33/10; G01R 35/005; G01R 35/00; G01R 33/00; G01R 33/0094; G01R 33/0064; G01C 17/38; G06F 17/00; G06F 17/40; G06F 17/10; G06F 17/15; G06F 17/16; G06F 17/17; G06F 17/14; G06F 17/141; G06F 17/145;
(Continued)

(56) References Cited

U.S. PATENT DOCUMENTS

| | | | |
|---|---|---|---|
| 2013/0177208 A1* | 7/2013 | Haverinen | G01C 21/08 702/94 |
| 2015/0177020 A1* | 6/2015 | An | G01P 21/00 702/92 |

(Continued)

FOREIGN PATENT DOCUMENTS

| | | |
|---|---|---|
| CN | 115839726 A | 3/2023 |
| JP | 2013-057552 A | 3/2013 |

(Continued)

OTHER PUBLICATIONS

PCT International Search Report and Written Opinion, PCT Application No. PCT/IB2024/053257, Jul. 10, 2024, 10 pages.
(Continued)

*Primary Examiner* — Alvaro E Fortich
(74) *Attorney, Agent, or Firm* — Fenwick & West LLP (57) ABSTRACT

The disclosure describes a method for calibrating a magnetic sensor of a client device. The method may include receiving a set of magnetic field measurements, each of which includes a device location, an orientation of the client device, and an observed magnetic field vector measured by the magnetic sensor. The method may include computing a device correction vector for the client device based on the set of magnetic field measurements. For each magnetic field measurement, the method includes determining a world magnetic field vector at the device location of the magnetic field measurement, computing an expected measured magnetic field vector at the device location, accessing an estimated device correction vector for the client device, computing an expected adjusted vector for the client device, comparing the observed magnetic field vector associated with the magnetic field measurement and the expected adjusted vector, and computing the device correction vector based on the comparison.

20 Claims, 4 Drawing Sheets

(58) Field of Classification Search
CPC ...... G06F 17/147; G06F 17/148; G06F 17/13; G06F 17/12
See application file for complete search history.

(56) References Cited

U.S. PATENT DOCUMENTS

| | | | |
|---|---|---|---|
| 2015/0260524 A1* | 9/2015 | Haverinen | H04W 4/80 455/456.1 |
| 2018/0080768 A1* | 3/2018 | Vasilyuk | G01C 17/38 |
| 2020/0025570 A1 | 1/2020 | Li et al. | |
| 2022/0365351 A1 | 11/2022 | Woods et al. | |
| 2023/0410349 A1 | 12/2023 | Arnold et al. | |

FOREIGN PATENT DOCUMENTS

| | | |
|---|---|---|
| KR | 2004-0013439 A | 2/2004 |
| KR | 2021-0124708 A | 10/2021 |
| WO | WO-2021/245640 A1 | 12/2021 |

OTHER PUBLICATIONS

Lin, W., et al., "A Three-Step Calibration Method of Sensor' Pose for Magnetic Localization System," IEEE Transactions on Instrumentation And Measurement, vol. 72, Sep. 20, 2023, pp. 1-10.

Wittmann, F., et al., "Magnetometer-Based Drift Correction During Rest in IMU Arm Motion Tracking", Sensors, vol. 19, Issue 6, Mar. 15, 2019, pp. 1-19.

United States Office Action, U.S. Appl. No. 18/297,179, filed Sep. 5, 2024, 13 pages.

\* cited by examiner

MAGNETIC SENSOR CALIBRATION USING VIO SYSTEM

TECHNICAL FIELD

The subject matter described relates generally to magnetic sensor calibration, and, in particular, to calibrating a magnetic sensor for a client device.

BACKGROUND

An online system may track the location and orientation (collectively "pose") of a user device in the physical world to provide services to the user. For example, in augmented reality (AR) applications, an online system may overlay virtual elements on the depiction of the real-world environment. Specifically, the online system may display a virtual element over a video feed captured by the user device and displayed to the user such that the virtual element appears to be located within the physical world. The online system uses the device's pose to correctly display the virtual element. For example, the online system may use the device's orientation to determine whether to display the virtual element and if so, where in the video feed to display the virtual element.

To determine a user device's pose, the online system may use magnetic field measurements captured by the user device to estimate the user device's orientation relative to the magnetic field generated by the Earth. For example, the online system may use a compass on the user's phone to determine the device orientation relative to the Earth's magnetic field. However, the electronics or any metal structures within the user device itself may generate magnetic fields that may be captured by the device's magnetic sensor. Thus, the magnetic field measured by the magnetic sensor can be a sum of two vectors: magnetic field of from the Earth and the magnetic field from the device itself. Thus, to provide magnetic field measurements that accurately measure the magnetic field from the Earth, the user device attempts to correct for the magnetic field generated by the user device.

Existing approaches to calibrate magnetic sensors are mostly based on optimizing over many instantaneous rotation measurements and the magnetic sensor's readings. For example, one way to calibrate a compass in a phone requires a user to turn the phone to make a figure-eight pattern. However, this technique requires the user to perform the motion several times until the compass is calibrated. Thus, the user device cannot regularly calibrate its magnetic sensors without significantly inconveniencing the user.

SUMMARY

A client device uses visual inertial odometry (VIO) data to calibrate a magnetic sensor on the client device. The client device uses VIO to determine the orientation of the client device when the client device captures magnetic field measurements. The magnetic field measurements may include an observed magnetic field vector representing the measured magnetic field by the client device's magnetic sensor, a location of the client device when the client device captured the magnetic field vector, and the orientation of the client device as determined using VIO. In some embodiments, the client device uses a batch of magnetic field measurements collected within a specified geographic area to calibrate the magnetic sensor.

The client device uses a set of these magnetic field measurements to compute a device correction vector. A device correction vector (labeled herein as $V_{Correction}$) is a vector that represents errors in magnetic field vectors measured by the client device's magnetic sensor. These errors come from electronics within the client device that generate magnetic fields, and represent a difference between the actual magnetic field measured by the magnetic sensor and the magnetic field generated by the Earth. Thus, once the client device computes the device correction vector, the client device can subtract the device correction vector from the magnetic field vector measured by the magnetic field sensor to determine a magnetic field vector for the Earth's magnetic field.

To compute the device correction vector, the client device determines a world magnetic field vector at the device location corresponding to each magnetic field measurement. The world magnetic field vector (labeled herein as $V_{World}$) is a vector that represents the Earth's local magnetic field at the corresponding device location, and is in the world's reference frame. The client device computes an expected measured magnetic field vector at the device location based on the world magnetic field vector and the orientation of the client device as determined through the VIO data. The expected magnetic field vector (labeled herein as $V_{Expect}$) is a vector in the client device's reference frame that represents an expected magnetic field measurement at the device location without the magnetic field generated by the client device. Thus, the expected magnetic field vector may represent the world magnetic field vector that has been converted to the client device reference frame based on the orientation of the client device and, if the client device did not produce any magnetic fields itself, the expected magnetic field vector would be equal to the observed magnetic field vector measured by the magnetic sensor.

The client device uses an existing estimated device correction vector to compute an expected adjusted vector. The expected adjusted vector (labeled herein as $V_{Adjust}$) is a magnetic field vector in the device reference frame that represents an expected measured magnetic field vector after correction using the device correction vector. In other words, if the current estimated device correction vector were perfectly accurate, the expected adjusted vector should be equal to the observed magnetic field vector measured by the magnetic sensor. However, if the estimated device correction vector is inaccurate, the client device uses the difference between the expected adjusted vector and the observed magnetic field vector to update the estimated device correction vector. By performing this process for each of a set of magnetic field measurements, the client device can iteratively update the device correction vector to compute a final device correction vector to be used on future magnetic field measurements.

By using VIO to compute the client device's orientation, the client device can calibrate its magnetic sensor without requiring the user to perform a specific motion (e.g., a figure-eight) with the client device. Thus, the client device can more regularly calibrate its magnetic sensor than prior art methods.

The figures and the following description describe certain embodiments by way of illustration only. One skilled in the art will readily recognize from the following description that alternative embodiments of the structures and methods may be employed without departing from the principles described. Reference will now be made to several embodiments, examples of which are illustrated in the accompanying figures.

DETAILED DESCRIPTION

Various embodiments are described in the context of a parallel reality game that includes augmented reality content in a virtual world geography that parallels at least a portion of the real-world geography such that player movement and actions in the real-world affect actions in the virtual world and vice versa. Those of ordinary skill in the art, using the disclosures provided herein, will understand that the subject matter described is applicable in other situations where magnetic field measurements are desirable. For example, the method described herein may be implemented in a location-based application that displays virtual navigation instructions or text labels that relate to real-world information. In addition, the inherent flexibility of computer-based systems allows for a great variety of possible configurations, combinations, and divisions of tasks and functionality between and among the components of the system. For instance, the systems and methods according to aspects of the present disclosure can be implemented using a single computing device or across multiple computing devices (e.g., connected in a computer network).

Figure 1:
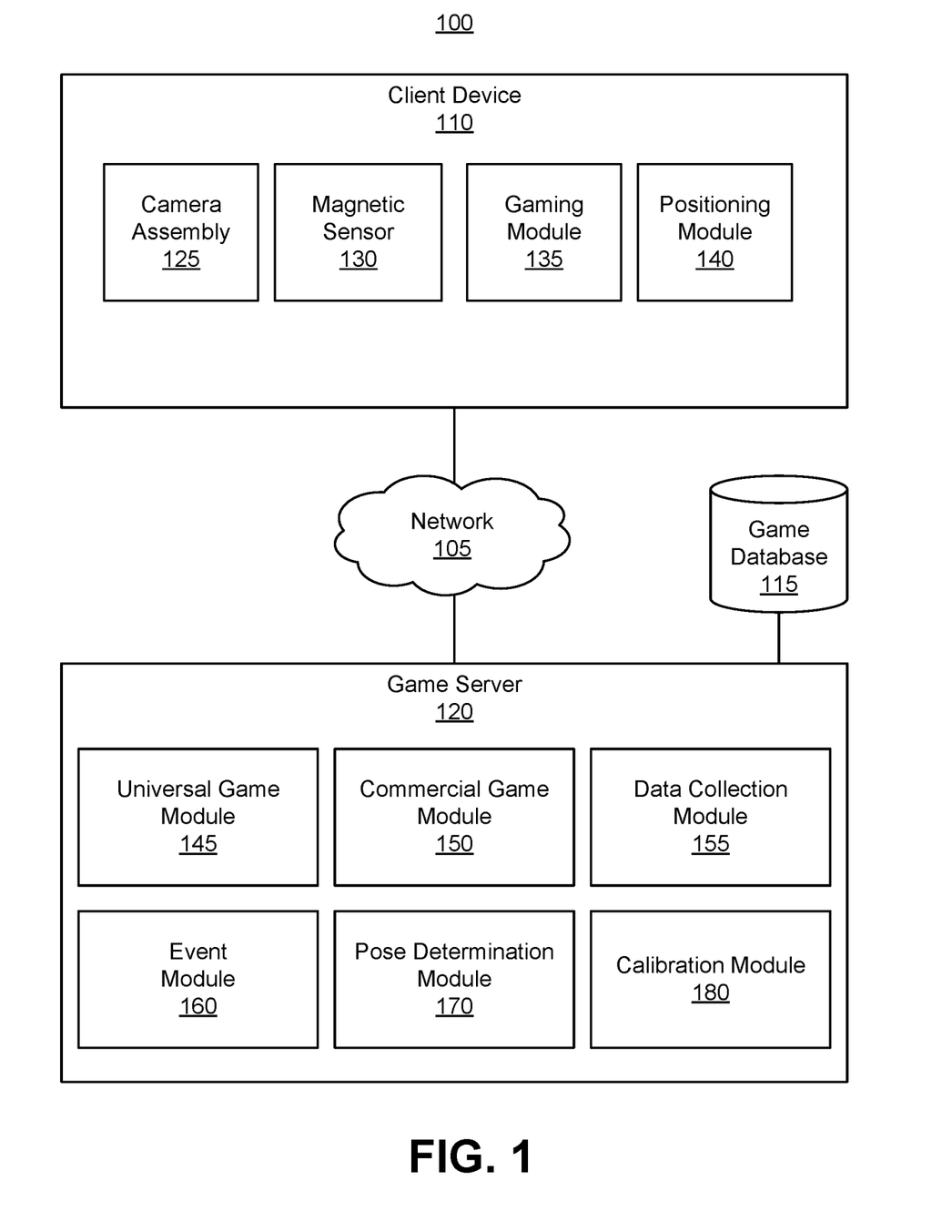
FIG. 1 illustrates a networked computing environment, according to one embodiment.

FIG. 1 illustrates a networked computing environment 100, in accordance with one or more embodiments. Although FIG. 1 depicts a parallel reality gaming environment as an example, but the describe methods/systems may be used in other contexts. In practice, and as recognized by those of ordinary skill in the art, a networked computing environment may have additional, less, or variations of the components provided in FIG. 1. Specifically, the magnetic sensor calibration described is applicable in any environment where calibration of a magnetic sensor is desirable. Additionally, functionality of each of the components may be divided up differently from the description below. For example, the client device may compute a device correction vector locally or by transmitting measurements to a remote server (e.g., game server 120) to compute the device correction vector.

The networked computing environment 100 provides for the interaction of players in a virtual world having a geography that parallels the real world. In particular, a geographic area in the real world can be linked or mapped directly to a corresponding area in the virtual world. A player can move about in the virtual world by moving to various geographic locations in the real world. For instance, a player's position in the real world can be tracked and used to update the player's position in the virtual world. Typically, the player's position in the real world is determined by finding the location of a client device 110 through which the player is interacting with the virtual world and assuming the player is at the same (or approximately the same) location. For example, in various embodiments, the player may interact with a virtual element if the player's location in the real world is within a threshold distance (e.g., ten meters, twenty meters, etc.) of the real-world location that corresponds to the virtual location of the virtual element in the virtual world. For convenience, various embodiments are described with reference to "the player's location" but one of skill in the art will appreciate that such references may refer to the location of the player's client device 110.

The networked computing environment 100 uses a client-server architecture, where a game server 120 communicates with a client device 110 over a network 105 to provide a parallel reality game to players at the client device 110. The networked computing environment 100 also may include other external systems such as sponsor/advertiser systems or business systems. Although only one client device 110 is illustrated in FIG. 1, any number of client devices 110 or other external systems may be connected to the game server 120 over the network 105. Furthermore, the networked computing environment 100 may contain different or additional elements and functionality may be distributed between the client device 110 and the server 120 in a different manner than described below.

A client device 110 can be any portable computing device that can be used by a player to interface with the game server 120. For instance, a client device 110 can be a wireless device, a personal digital assistant (PDA), portable gaming device, cellular phone, smart phone, tablet, navigation system, handheld GPS system, wearable computing device, a display having one or more processors, or other such device. In another instance, the client device 110 includes a conventional computer system, such as a desktop or a laptop computer. Still yet, the client device 110 may be a vehicle with a computing device. In short, a client device 110 can be any computer device or system that can enable a player to interact with the game server 120. As a computing device, the client device 110 can include one or more processors and one or more computer-readable storage media. The computer-readable storage media can store instructions which cause the processor to perform operations. The client device 110 is preferably a portable computing device that can be easily carried or otherwise transported with a player, such as a smartphone or tablet.

The client device 110 communicates with the game server 120 providing the game server 120 with sensory data of a physical environment. The client device 110 includes a camera assembly 125 that captures image data in two dimensions of a scene in the physical environment where the client device 110 is. In the embodiment shown in FIG. 1, each client device 110 includes a magnetic sensor 130 and software components such as a gaming module 135 and a positioning module 140. The client device 110 may include various other input/output devices for receiving information from and/or providing information to a player. Example input/output devices include a display screen, a touch screen, a touch pad, data entry keys, speakers, and a microphone suitable for voice recognition. The client device 110 may also include other various sensors for recording data from the client device 110 including but not limited to movement sensors, accelerometers, gyroscopes, other inertial measurement units (IMUs), barometers, positioning systems, thermometers, light sensors, depth sensors, etc. The captured images and the various sensory data may be used as visual inertial odometry (VIO) data. The client device 110 may send the VIO data to the pose determination module 170 to determine a pose of the client device 110, e.g., the orientation of the client device 110. The client device 110 can further include a network interface for providing communications over the network 105. A network interface can include any suitable components for interfacing with one more networks, including for example, transmitters, receivers, ports, controllers, antennas, or other suitable components.

The camera assembly 125 captures image data of a scene of the environment in which the client device 110 is located. The camera assembly 125 may utilize a variety of varying photo sensors with varying color capture ranges at varying capture rates. The camera assembly 125 may contain a wide-angle lens or a telephoto lens. The camera assembly 125 may be configured to capture single images or video as the image data. Additionally, the orientation of the camera assembly 125 could be parallel to the ground with the camera assembly 125 aimed at the horizon. The camera assembly 125 captures image data and shares the image data with the computing device on the client device 110. The image data can be appended with metadata describing other details of the image data including sensory data (e.g., temperature, brightness of environment) or capture data (e.g., exposure, warmth, shutter speed, focal length, capture time, etc.). The camera assembly 125 can include one or more cameras which can capture image data. In one instance, the camera assembly 125 comprises one camera and is configured to capture monocular image data. In another instance, the camera assembly 125 comprises two cameras and is configured to capture stereoscopic image data. In various other implementations, the camera assembly 125 comprises a plurality of cameras each configured to capture image data.

The magnetic sensor 130 is a sensor that captures magnetic field measurements. For example, the magnetic sensor 130 may include a compass, a magnetometer, or a magnetic field detector. The magnetic sensor 130 captures magnetic field measurements of the magnetic field generated by the Earth and the magnetic field generated by electronics within the client device 110 itself. In other words, measurements captured by the magnetic sensor may reflect the sum of the Earth's magnetic field and the client device's magnetic field. The magnetic sensor may periodically capture magnetic field measurements or may capture magnetic field measurements when instructed to do so by a processor of the client device 110. The client device 110 may use the positioning module 140 to determine the location of the client device 110 when the magnetic sensor 130 captures magnetic field measurements.

In one embodiment, the magnetic sensor 130 includes three separate sensors internally aligned separately on the x, y and z axis of the client device 110. The x, y, and z axis define a body frame, i.e., device reference frame, of the client device 110. Each of these three sensors measures the intensity of the magnetic field at the location of the client device 110. The three measured magnetic field intensities may be combined (e.g., using vector addition) to produce a magnetic field vector at the location of the client device 110 (i.e., local magnetic field vector). Take a smartphone as an example of the client device 110. The z-axis may be perpendicular to the plane of the smartphone, the x-axis is along the short length to the right, and the y-axis along the long length to the front. When a smartphone is facing up and its plane is parallel to the ground surface, the z-axis of the smartphone points up. Assuming the magnetic sensor 130 measures a large intensity along the y-axis and a small (or zero) intensity along the x-axis, a vector addition of the intensities calculates the local magnetic field vector that is aligned with the y-axis of the smartphone. If the local magnetic field vector is the same as the Earth's magnetic field and points to the geographic north, then the y-axis of the smartphone is pointing to the geographic north (i.e., the magnetic south) and the x-axis of the smartphone may be pointing to the geographic east. Therefore, based on the device reference frame of the smartphone, the front of smartphone is pointing to the geographic north. When rotating the smartphone in the horizontal plane, the measured local magnetic field vector will rotate according in the device reference frame. As the device reference frame is known, the magnetic sensor 130 may convert the measured local magnetic vector from the device reference frame to the Earth frame (i.e., world reference frame) to determine the orientation of the client device 110 in physical space.

The gaming module 135 provides a player with an interface to participate in the parallel reality game. The game server 120 transmits game data over the network 105 to the client device 110 for use by the gaming module 135 at the client device 110 to provide local versions of the game to players at locations remote from the game server 120. The game server 120 can include a network interface for providing communications over the network 105. A network interface can include any suitable components for interfacing with one more networks, including for example, transmitters, receivers, ports, controllers, antennas, or other suitable components.

The gaming module 135 executed by the client device 110 provides an interface between a player and the parallel reality game. The gaming module 135 can present a user interface on a display device associated with the client device 110 that displays a virtual world (e.g., renders imagery of the virtual world) associated with the game and allows a user to interact in the virtual world to perform various game objectives. In some embodiments, the gaming module 135 presents image data from the real world (e.g., captured by the camera assembly 125) augmented with virtual elements from the parallel reality game. In these embodiments, the gaming module 135 may generate virtual content and/or adjust virtual content according to other information received from other components of the client device 110. For example, the gaming module 135 may adjust a virtual object to be displayed on the user interface according to a depth map of the scene captured in the image data. In other embodiments, the gaming module 135 generates virtual objects for display on a semi-transparent display through which the user views the real world (e.g., an AR headset, AR glasses, etc.). Thus, the virtual objects may be overlaid on the user's view of the real world.

The gaming module 135 can also control various other outputs to allow a player to interact with the game without requiring the player to view a display screen. For instance, the gaming module 135 can control various audio, vibratory, or other notifications that allow the player to play the game without looking at the display screen. The gaming module 135 can access game data received from the game server 120 to provide an accurate representation of the game to the user. The gaming module 135 can receive and process player input and provide updates to the game server 120 over the network 105. The gaming module 135 may also generate and/or adjust game content to be displayed by the client device 110. For example, the gaming module 135 may generate a virtual element based on depth information. In another example, the gaming module 135 may update a virtual element based on a pose of the camera assembly.

In one embodiment, determination of a coarse position of the client device 110 may be performed at the client device 110. The client device 110 includes a positioning module 140 comprising any device or circuitry for monitoring the position of the client device 110. For example, the positioning module 140 can determine actual or relative position by using a satellite navigation positioning system (e.g. a GPS system, a Galileo positioning system, the Global Navigation satellite system (GLONASS), the BeiDou Satellite Navigation and Positioning system), an inertial navigation system, a dead reckoning system, based on IP address, by using triangulation and/or proximity to cellular towers or Wi-Fi hotspots, and/or other suitable techniques for determining position. The positioning module 140 may also use the measured magnetic field data from the magnetic sensor 130 in determining the location of the client device 110 in the physical space. The positioning module 140 may further include various other sensors that may aid in accurately positioning the client device 110 location. While the positioning module 140 may be used to determine a course position of the client device 110, re-localization of the client device 110 (e.g., to determine the device's fine-grain location and orientation) is performed by the pose determination module 170 on the game server 120, as discussed below. For example, the coarse location (e.g., the GPS coordinates) identified by the positioning module 140 may be used to identify a three-dimensional (3D) model of the environment in which the client device 110 is located, and the pose determination module 170 localizes against the retrieved model using images captured by the camera assembly 125 and the magnetic field measured by the magnetic sensor 130 on the client device 110.

In embodiments in which a coarse position of the client device is determined client-side, the positioning module 140 tracks the position of the player as the player moves around with the client device 110 in the real world and provides the player position information to the gaming module 135. The gaming module 135 updates the player position in the virtual world associated with the game based on the actual position of the player in the real world. Thus, a player can interact with the virtual world simply by carrying or transporting the client device 110 in the real world. In particular, the location of the player in the virtual world can correspond to the location of the player in the real world. The gaming module 135 can provide player position information to the game server 120 over the network 105. In response, the game server 120 may enact various techniques to verify the client device 110 location to prevent cheaters from spoofing the client device 110 location. It should be understood that location information associated with a player is utilized only if permission is granted after the player has been notified that location information of the player is to be accessed and how the location information is to be utilized in the context of the game (e.g., to update player position in the virtual world). In addition, any location information associated with players will be stored and maintained in a manner to protect player privacy.

The game server 120 can be any computing device and can include one or more processors and one or more computer-readable storage media. The computer-readable storage media can store instructions which cause the processor to perform operations. The game server 120 can include or can be in communication with a game database 115. The game database 115 stores game data used in the parallel reality game to be served or provided to the client(s) 110 over the network 105.

The game data stored in the game database 115 can include: (1) data associated with the virtual world in the parallel reality game (e.g. imagery data used to render the virtual world on a display device, geographic coordinates of locations in the virtual world, etc.); (2) data associated with players of the parallel reality game (e.g. player profiles including but not limited to player information, player experience level, player currency, current player positions in the virtual world/real world, player energy level, player preferences, team information, faction information, etc.); (3) data associated with game objectives (e.g. data associated with current game objectives, status of game objectives, past game objectives, future game objectives, desired game objectives, etc.); (4) data associated with virtual elements in the virtual world (e.g. positions of virtual elements, types of virtual elements, game objectives associated with virtual elements; corresponding actual world position information for virtual elements; behavior of virtual elements, relevance of virtual elements etc.); (5) data associated with real-world objects, landmarks, positions linked to virtual-world elements (e.g. location of real-world objects/landmarks, description of real-world objects/landmarks, relevance of virtual elements linked to real-world objects, etc.); (6) game status (e.g. current number of players, current status of game objectives, player leaderboard, etc.); (7) data associated with player actions/input (e.g. current player positions, past player positions, player moves, player input, player queries, player communications, etc.); and (8) any other data used, related to, or obtained during implementation of the parallel reality game. The game data stored in the game database 115 can be populated either offline or in real time by system administrators and/or by data received from users/players of the environment 100, such as from a client device 110 over the network 105.

The game server 120 can be configured to receive requests for game data from a client device 110 (for instance via remote procedure calls (RPCs)) and to respond to those requests via the network 105. For instance, the game server 120 can encode game data in one or more data files and provide the data files to the client device 110. In addition, the game server 120 can be configured to receive game data (e.g., player positions, player actions, player input, etc.) from a client device 110 via the network 105. For instance, the client device 110 can be configured to periodically send player input and other updates to the game server 120, which the game server 120 uses to update game data in the game database 115 to reflect any and all changed conditions for the game.

In the embodiment shown, the game server 120 includes a universal gaming module 145, a commercial game module 150, a data collection module 155, an event module 160, a pose determination module 170, and a calibration module 180. As mentioned above, the game server 120 interacts with a game database 115 that may be part of the game server 120 or accessed remotely (e.g., the game database 115 may be a distributed database accessed via the network 105). In other embodiments, the game server 120 contains different and/or additional elements. In addition, the functions may be distributed among the elements in a different manner than described. For instance, the game database 115 can be integrated into the game server 120. Additionally, while the pose determination module 170 and the calibration module 180 are described as located on the game server 120, in other embodiments, pose determination and/or magnetic sensor calibration is performed at the client device 110, as discussed above.

The universal game module 145 hosts the parallel reality game for all players and acts as the authoritative source for the current status of the parallel reality game for all players. As the host, the universal game module 145 generates game content for presentation to players, e.g., via their respective client devices 110. The universal game module 145 may access the game database 115 to retrieve and/or store game data when hosting the parallel reality game. The universal game module 145 also receives game data from client device 110 (e.g., depth information, player input, player position, player actions, landmark information, etc.) and incorporates the game data received into the overall parallel reality game for all players of the parallel reality game. The universal game module 145 can also manage the delivery of game data to the client device 110 over the network 105. The universal game module 145 may also govern security aspects of client device 110 including but not limited to securing connections between the client device 110 and the game server 120, establishing connections between various client device 110, and verifying the location of the various client device 110.

The commercial game module 150, in embodiments where one is included, can be separate from or a part of the universal game module 145. The commercial game module 150 can manage the inclusion of various game features within the parallel reality game that are linked with a commercial activity in the real world. For instance, the commercial game module 150 can receive requests from external systems such as sponsors/advertisers, businesses, or other entities over the network 105 (via a network interface) to include game features linked with commercial activity in the parallel reality game. The commercial game module 150 can then arrange for the inclusion of these game features in the parallel reality game.

The game server 120 can further include a data collection module 155. The data collection module 155, in embodiments where one is included, can be separate from or a part of the universal game module 145. The data collection module 155 can manage the inclusion of various game features within the parallel reality game that are linked with a data collection activity in the real world. For instance, the data collection module 155 can modify game data stored in the game database 115 to include game features linked with data collection activity in the parallel reality game. The data collection module 155 can also analyze and data collected by players pursuant to the data collection activity and provide the data for access by various platforms.

The event module 160 manages player access to events in the parallel reality game. Although the term "event" is used for convenience, it should be appreciated that this term need not refer to a specific event at a specific location or time. Rather, it may refer to any provision of access-controlled game content where one or more access criteria are used to determine whether players may access that content. Such content may be part of a larger parallel reality game that includes game content with less or no access control or may be a stand-alone, access controlled parallel reality game.

The pose determination module 170 may use the VIO data from the client device 110 to estimate a pose of the client device 110. The VIO data may include images captured by the camera assembly 125 and other sensor data. In some embodiments, the pose determination module 170 uses a computer vision algorithm to estimate the pose of the one or more cameras of the camera assembly 125. The pose determination module 170 is trained to determine the relative pose of a camera from one or more images captured by that camera relative to one or more existing images of the physical environment around the client device 110. In one embodiment, the pose determination module 170 uses GPS coordinates (e.g., received from the positioning module 140 on the client device 110) to retrieve a 3D model of the environment in which the client device 110 is located. In various implementations, the 3D model may be a point cloud or mesh topology generated from previously captured images of the environment. The pose determination module 170 then compares the one or more images captured by the camera assembly 125 to the retrieved 3D model to generate the pose estimate of the client device 110.

The calibration module 180 is configured to calibrate the magnetic sensor 130 of the client device 110 based on the received magnetic field measurements from the client device 110. To calibrate the magnetic sensor 130, the calibration module 180 estimates a device correction vector for the magnetic sensor 130. The device correction vector is a vector that represents errors in magnetic field measurements caused by the magnetic field introduced by the client device 110. Thus, the magnetic sensor 130 may be calibrated by offsetting its measured magnetic vector by the device correction vector.

A magnetic field vector at a device location in the world reference frame may be referred to a world magnetic field vector and labeled as $V_{World}$. The world magnetic field vector $V_{World}$ (sometimes referred to herein as the local magnetic field vector) is a vector that represents a local magnetic field at the device location due to the Earth's magnetic field. The expected measured magnetic field vector is the world magnetic field vector converted to a reference frame of the device, labeled as $V_{Expect}$. Thus, the expected measured magnetic field vector is a vector in a device reference frame that represents an expected magnetic field measurement at the device location if the magnetic sensor was not affected by a magnetic field introduced by the client device 110. A device correction vector is a vector that represents errors in magnetic field measurements caused by a magnetic field introduced by the client device 110, labeled as $V_{Correction}$, which is also presented in the device reference frame. The magnetic sensor 130 may observe the local magnetic field vector in the device reference frame, and an observed magnetic field vector ($V_{Observed}$) stands for the magnetic field actually measured by the magnetic sensor 130 at the device location. The magnetic sensor 130 measures both the local magnetic field generated by the Earth and the magnetic field introduced by the client device 110, thus an expected adjusted vector ($V_{Adjust}$) is a vector addition of the expected measured magnetic field vector ($V_{Expect}$) and the device correction vector ($V_{Correction}$), i.e., $V_{Adjust} = V_{Expect} + V_{Correction}$. The expected adjusted vector is a vector in the device reference frame that represents an expected magnetic field measurement at the device location after adjusting for the magnetic field introduced by the client device 110.

The calibration module 180 may receive the world magnetic field vector ($V_{World}$) from the positioning module 140 or the data collection module 155. The calibration module 180 alternatively may compute the local magnetic field vector based on the device's location and based on a map of the Earth's magnetic field at different locations. The calibration module 180 may receive the map of the Earth's magnetic field from a third-party system.

The magnetic sensor 130 measures magnetic field vectors in the device reference frame. To calibrate the magnetic sensor 130, the calibration module 180 may convert the world magnetic field vector ($V_{World}$) into the device reference frame. The calibration module 180 may perform conversions from the world reference frame to the device reference frame by using a pose estimate of the client device 110. The pose estimate of the client device 110 includes an orientation of the client device 110 in the world reference frame, thus providing a rotation matrix (conversion matrix) that convers a vector between the world reference frame and the device reference frame.

After conversion from the world reference frame to the device reference frame, the local magnetic field vector is an expected measured magnetic field vector, represented as $V_{Expect}$. The expected measured magnetic field vector is a vector in the device reference frame that represents an expected magnetic field measurement at the device location without the magnetic field introduced by the client device 110.

As explained above, the magnetic field generated by the client device causes there to be a difference between the expected measured magnetic field vector $V_{Expect}$ and the actually observed magnetic field vector, $V_{Observed}$. This difference is corrected by the device correction vector ($V_{Correction}$). To find the difference between the expected measured magnetic field vector ($V_{Expect}$) and the observed magnetic field vector ($V_{Observed}$), i.e., the device correction vector, the calibration module 180 may receive and analyze a set of magnetic field measurements. Each magnetic field measurement may include a device location of the client device 110 where the magnetic field measurement is taken and an observed magnetic field vector ($V_{Observed}$) measured by the magnetic sensor 130 at the device location. In some embodiments, the calibration module 180 may receive an orientation of the client device 110 when the magnetic field measurement was captured. The calibration module 180 may group the received data including the magnetic field measurements and VIO data using bin measurements based on the device location.

The calibration module 180 may compute the device correction vector ($V_{Correction}$) based on the set of magnetic field measurements. The calibration module 180 may access an estimated device correction vector ($V_{Correction}$). The device correction vectors ($V_{Correction}$) for a magnetic sensor 130, represented in the device reference frame, are the same for all magnetic field measurements. The calibration module 180 computes an expected adjusted vector ($V_{Adjust}$) based on the expected measured magnetic field vector ($V_{Expect}$) and an estimated device correction vector ($V_{Correction}$). Here, $V_{Adjust}=V_{Expect}+V_{Correction}$. The expected adjusted vector ($V_{Adjust}$) is a vector in the device reference frame that represents an expected magnetic field measurement at the device location after adjusting for the magnetic field introduced by the client device 110. The calibration module 180 may compare the observed magnetic field ($V_{Observed}$) and the expected adjusted vector ($V_{Adjust}$) to obtain the device correction vector ($V_{Correction}$). The calibration module 180 optimizes the device correction vector ($V_{Correction}$) using an optimization algorithm. The optimization algorithm may use the set of magnetic field measurements to optimize the device correction vector ($V_{Correction}$) to obtain a minimum cost value based on a cost function. In some embodiments, the estimated device correction vector associated with the minimum value may be determined as the device correction vector ($V_{Correction}$). The calibration module 180 then stores the optimized the device correction vector ($V_{Correction}$) for calibrating the magnetic sensor 130 of the client device 110.

Referring back to FIG. 1, once the device correction vector is determined, when the magnetic sensor 130 measures a magnetic field vector, the calibration module 180 may calibrate the magnetic sensor 130 and use the device correction vector to adjust the measured magnetic field vector. In some embodiments, the calibration module 180 may continuously receive additional sets of magnetic field measurements from the client device 110 and use the additional sets of magnetic field measurements to continuously update the estimated device offset magnetic field.

In some embodiments, the calibration module 180 performs an iterative process over a set of magnetic field measurements to compute the device correction vector. Each of the magnetic field measurements may have been collected within a particular geographic region to ensure that the world magnetic field vector is relatively stable between the magnetic field measurements. The calibration module 180 continually adjusts an estimated device correction vector based on each of the magnetic field measurements (e.g., using a gradient-descent-like process) until the calibration module 180 has processed all of the magnetic field measurements in the set of magnetic field measurements. The calibration module 180 may use the final estimated device correction vector as the device correction vector for the client device.

The calibration module 180 may alternatively perform a batch process to compute the device correction vector for a set of magnetic field measurements. As described above, each magnetic field measurement includes a magnetic field vector ($V_{Observed}$) that was observed at a given location. Additionally, the calibration module 180 computes an expected magnetic field vector ($V_{Expect}$) based on the location at which the magnetic field measurements were taken. In some embodiments, each magnetic field measurement includes a location at which the magnetic field measurement was taken and the calibration module 180 computes an expected magnetic field vector for each magnetic field measurement. Alternatively, if the set of magnetic field measurements are within a particular geographic region such that the expected magnetic field vector for each magnetic field measurement is substantially similar, the calibration module 180 may use the same expected magnetic field vector for each magnetic field measurement.

As explained above, if the device correction vector $V_{Correction}$ is perfectly calibrated, then the observed magnetic field vector should be equal to the sum of the device correction vector and the expected magnetic field vector. In other words, the following relationship should be true:

$$V_{Observed}=V_{Expect}+V_{Correction}$$

The calibration module 180 can use this expected linear relationship to compute the device correction vector using the set of magnetic field measurements. For example, the calibration module may compute the mean of all $V_{Observed}-V_{Expect}$ to compute $V_{Correction}$. Alternatively, since the calibration module 180 has a set observed magnetic field vectors and has calculated a set of expected magnetic field vectors for each magnetic field measurement, the calibration module 180 can use the equation for calculating a constant term in a linear regression analysis to compute the device correction vector. In other words, the device correction vector may be calculated based on the following formula:

$$V_{Correction} = \frac{\left(\sum_i^n V_{Observed,i}\right)\left(\sum_i^n V_{Expect,i}^2\right) - \left(\sum_i^n V_{Expect,i}\right)\left(\sum_i^n V_{Observed,i} V_{Expect,i}\right)}{n\left(\sum_i^n V_{Expect,i}^2\right)\left(\sum_i^n V_{Expect,i}\right)^2}$$

where n represents the number of magnetic field measurements in the set of magnetic field measurements. In some embodiments, the calibration module 180 may update the device correction vector using the iterative process described above.

The network 105 can be any type of communications network, such as a local area network (e.g., intranet), wide area network (e.g., Internet), or some combination thereof. The network can also include a direct connection between a client device 110 and the game server 120. In general, communication between the game server 120 and a client device 110 can be carried via a network interface using any type of wired and/or wireless connection, using a variety of communication protocols (e.g., TCP/IP, HTTP, SMTP, FTP), encodings or formats (e.g., HTML, XML, JSON), and/or protection schemes (e.g., VPN, secure HTTP, SSL).

The technology discussed herein makes reference to servers, databases, software applications, and other computer-based systems, as well as actions taken and information sent to and from such systems. One of ordinary skill in the art will recognize that the inherent flexibility of computer-based systems allows for a great variety of possible configurations, combinations, and divisions of tasks and functionality between and among components. For instance, server processes discussed herein may be implemented using a single server or multiple servers working in combination. Databases and applications may be implemented on a single system or distributed across multiple systems. Distributed components may operate sequentially or in parallel.

In addition, in situations in which the systems and methods discussed herein access and analyze personal information about users, or make use of personal information, such as location information, the users may be provided with an opportunity to control whether programs or features collect the information and control whether and/or how to receive content from the system or other application. No such information or data is collected or used until the user has been provided meaningful notice of what information is to be collected and how the information is used. The information is not collected or used unless the user provides consent, which can be revoked or modified by the user at any time. Thus, the user can have control over how information is collected about the user and used by the application or system. In addition, certain information or data can be treated in one or more ways before it is stored or used, so that personally identifiable information is removed. For example, a user's identity may be treated so that no personally identifiable information can be determined for the user.

According to aspects of the present disclosure, a player can interact with the parallel reality game by simply carrying a client device 110 around in the real world. For instance, a player can play the game by simply accessing an application associated with the parallel reality game on a smartphone and moving about in the real world with the smartphone. In this regard, it is not necessary for the player to continuously view a visual representation of the virtual world on a display screen in order to play the location-based game. As a result, a user interface can include a plurality of non-visual elements that allow a user to interact with the game. For instance, the game interface can provide audible notifications to the player when the player is approaching a virtual element or object in the game or when an important event happens in the parallel reality game. A player can control these audible notifications with an audio control. Different types of audible notifications can be provided to the user depending on the type of virtual element or event. The audible notification can increase or decrease in frequency or volume depending on a player's proximity to a virtual element or object. Other non-visual notifications and signals can be provided to the user, such as a vibratory notification or other suitable notifications or signals.

Those of ordinary skill in the art, using the disclosures provided herein, will appreciate that numerous game interface configurations and underlying functionalities will be apparent in light of this disclosure. The present disclosure is not intended to be limited to any one particular configuration.

Figure 2:
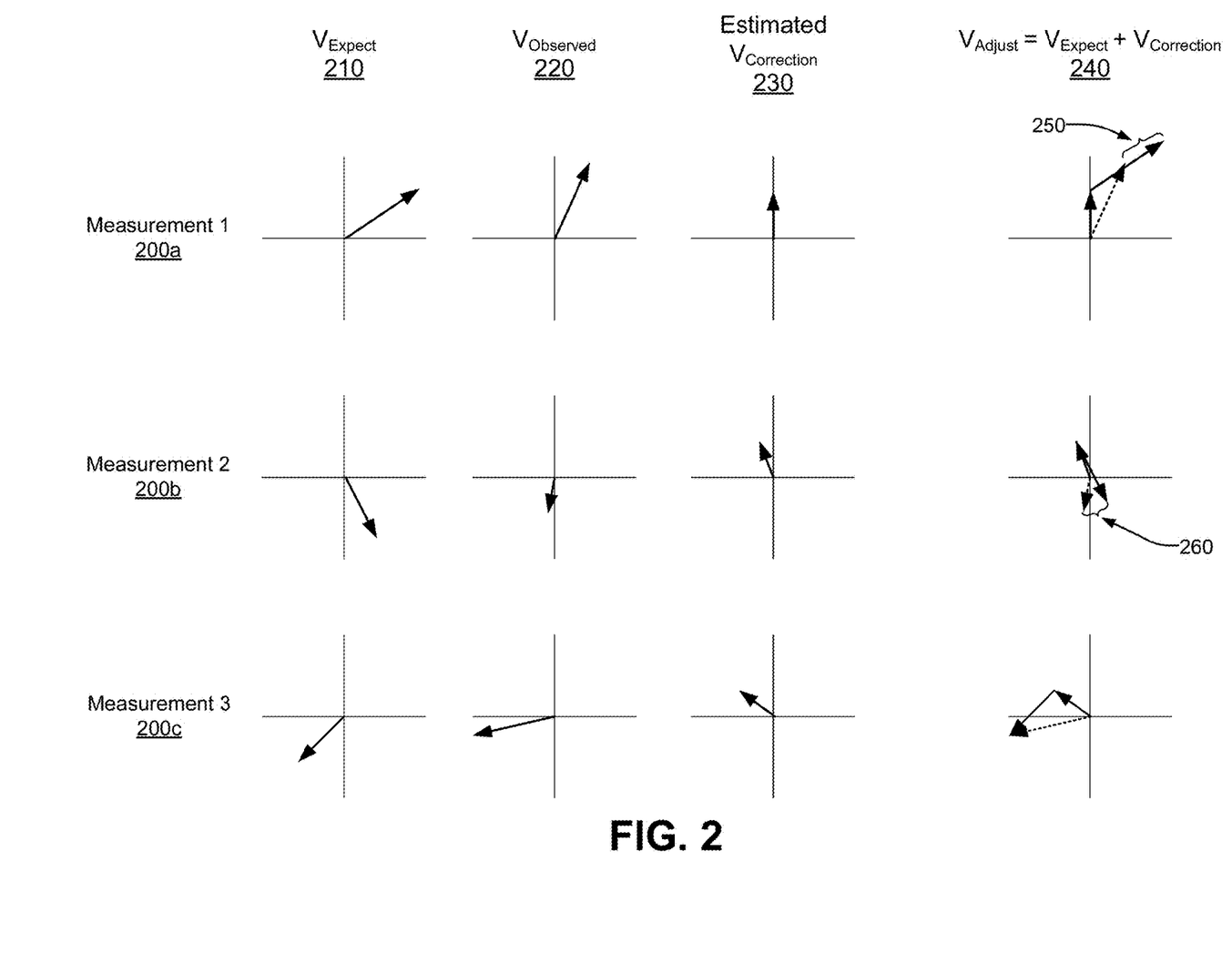
FIG. 2 illustrates a set of examples magnetic field measurements received from a client device for calibrating a magnetic sensor, according to one embodiment.

FIG. 2 illustrates a set of examples magnetic field measurements received from a client device for calibrating a magnetic sensor, in accordance with some embodiments. For each of the measurements 200, the corresponding expected magnetic field vector 210, observed magnetic field vector 220, estimated device correction vector 230, and expected adjusted vector 240 are shown. For measurement 1 200a, the estimated device correction vector 230 is at a default or starting value. Thus, the expected adjusted vector 240 computed based on that estimated device correction vector 230 may have a relatively large error 250. The estimated device correction vector 230 is adjusted based on the error 250 for measurement 2 200b. Since the estimated device correction vector 230 is closer to the true value for the device correction vector, the error 260 between the expected adjusted vector 240 and the observed magnetic field vector 220 is smaller than the first error 250. The estimated device correction vector 230 is adjusted again based on the second error 260 such that, for the measurement 3 200c, there is little to no difference between the expected adjusted vector 240 and the observed magnetic field vector 220. In some embodiments, if the difference between the expected adjusted vector 240 and the expected adjusted vector 240 is less than a threshold value, the associated estimated device correction vector 230 is stored as the device correction vector for the client device.

Figure 3:
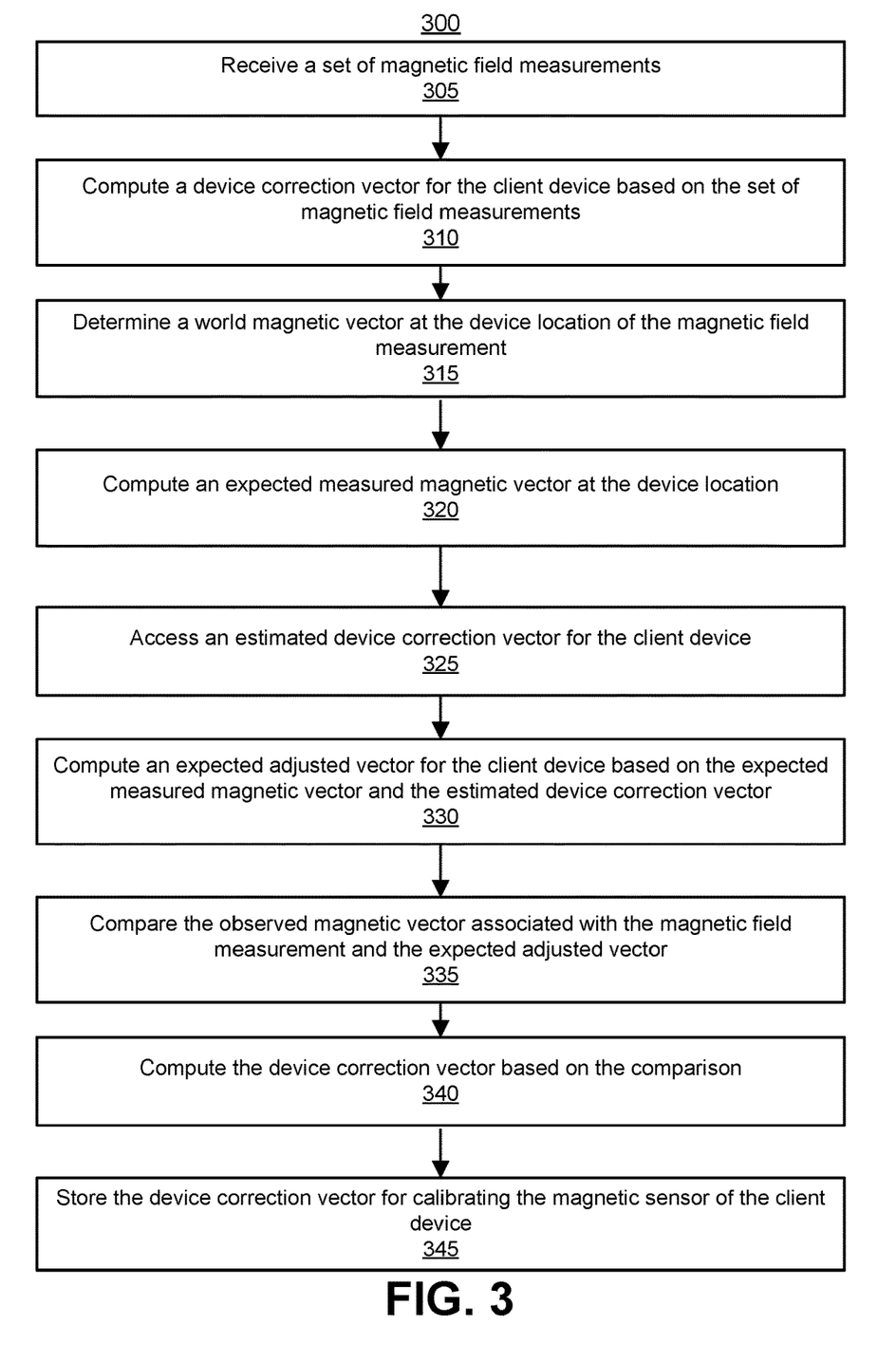
FIG. 3 is a flowchart describing a method of calibrating a magnetic sensor of a client device, according to one embodiment.

FIG. 3 is a flowchart describing a method 300 of calibrating the magnetic sensor 130 of a client device 110, in accordance one embodiment. The steps of FIG. 3 are illustrated from the perspective of the game server 120 performing the method 300. However, some or all of the steps may be performed by other entities and/or components. In addition, some embodiments may perform the steps in parallel, perform the steps in different orders, or perform different steps.

In the embodiment shown, the method 300 begins with the game server 120 receiving 305 a set of magnetic field measurements from the client device 110. Each magnetic field measurement may include a device location of the client device, an observed magnetic field vector measured at the device location by a magnetic sensor of the client device, and an orientation of the client device when the magnetic field measurement was captured. In some implementations, the game server 120 may receive 305 both magnetic field measurements and VIO data from the client device 110. The calibration module 180 in the game server 120 may group the received magnetic field measurements and the VIO data using bin measurements based on the device location.

The calibration module 180 computes 310 a device correction vector for the client device based on the set of magnetic field measurements. The device correction vector is a vector that represents errors in magnetic field measurements caused by a magnetic field introduced by the client device 110.

For each magnetic field measurement, the calibration module 180 determines 315 a world magnetic field vector at the device location of the magnetic field measurement. The world magnetic field vector is a vector that represents a local magnetic field at the device location in the world reference frame. The world magnetic field vector may refer to the magnetic field that surrounds the client device 110 at the device location. For example, the world magnetic field vector may be the earth magnetic field vector at the device location. The local magnetic field vector ($V_{World}$) is represented in the world reference frame.

The calibration module 180 computes 320 an expected measured magnetic field vector at the device location based on the world magnetic field vector and the orientation of the client device 110 associated with the magnetic field measurement. The expected measured magnetic field vector is a vector in the device reference frame that represents an expected magnetic field measurement at the device location without the magnetic field introduced by the client device 110.

In some implementations, the calibration module 180 converts the local magnetic field vector ($V_{World}$) from the world reference frame to the device reference frame by using a pose estimate of the client device 110. The pose estimate of the client device 110 includes an orientation of the client device 110 in the world reference frame, thus providing a rotation matrix that convers a vector between the world reference frame and the device reference frame.

The calibration module 180 accesses 325 an estimated device correction vector for the client device 110.

The calibration module 180 computes 330 an expected adjusted vector for the client device based on the expected measured magnetic field vector and the estimated device correction vector. The expected adjusted vector is a vector in the device reference frame that represents an expected magnetic field measurement at the device location after adjusting for the magnetic field introduced by the client device 110.

The calibration module 180 then compares 335 the observed magnetic field vector associated with the magnetic field measurement and the expected adjusted vector.

The calibration module 180 computes 340 the device correction vector based on the comparison. The magnetic sensor 130 readings include an error due to the magnetic field introduced by the client device 110, the calibration module 180 may optimize expected adjusted vector using an optimization algorithm. The optimization algorithm may use the set of magnetic field measurements to optimize the expected adjusted vector to obtain a minimum value. In some embodiments, the minimum value may be determined as the expected adjusted vector.

The calibration module 180 stores 345 the device correction vector for calibrating the magnetic sensor 130 of the client device 110.

The calibration module 180 may calibrate the magnetic sensor 130 and use the device correction vector to offset a measured magnetic field vector. For example, the calibration module 180 may sum a measured magnetic field vector with the device correction vector to compute a corrected magnetic field vector. The game server 120 may use the corrected magnetic field vector to determine an orientation of the client device 110. In some embodiments, the calibration module 180 may continuously receive additional sets of magnetic field measurements from the client device 110 and use the additional sets of magnetic field measurements to continuously update the estimated device offset magnetic field.

Example Alternative Embodiments

In the embodiments described above, the game server 120 uses a world magnetic field vector that is sufficiently accurate to compute the device correction vector for a client device 110. For example, the games server 120 may use the client device's location when a magnetic field measurement is captured to determine a world magnetic field vector for the client device when that magnetic field measurement is captured. As described above, the game server 120 may use these world magnetic field vectors to compute the device correction vector for the calibration of the client device's magnetometer.

However, in some embodiments, the game server 120 cannot estimate a world magnetic field vector with sufficient accuracy to effectively compute a device correction vector. In these embodiments, the game server 120 may rely on an assumption that the set of measurements used to compute the device correction vector each have approximately the same world magnetic field vector. For example, the game server 120 may access a set of magnetic field measurements that were all captured within a particular geographic region (e.g., within 1-2 meters of some geographic location). Since the magnetic field measurements were captured relatively close to one another, the world magnetic field vector is likely relatively constant among these magnetic field measurements. This assumption can be used to compute the device correction vector without receiving or determining the world magnetic field vector at the outset.

The game server 120 may use a device transformation matrix to compute the device correction vector. A device transformation matrix is a transformation matrix that transforms the world magnetic field vector into an expected magnetic field vector; that is, the device transformation matrix transforms the world magnetic field vector from the world reference frame to a vector in the device reference frame. The game server 120 generates a device transformation matrix for each measurement in the set of magnetic field measurements, and the device transformation matrix transforms the world magnetic field vector to the device reference frame based on the client device's pose when each magnetic field measurement is taken. The game server 120 generates a device transformation matrix for a magnetic field measurement based on VIO data captured by the client device 110 when the magnetic field measurement is captured. For example, the game server 120 may use VIO data to determine a pose of the client device 110 when the magnetic field measurement is captured, and may generate a device transformation matrix for the magnetic field measurements based on the determined pose of the client device. In some embodiments, the transformation matrix applies a rotation to a world magnetic field vector to transform it into an expected magnetic field vector.

To compute the device correction vector, the game server 120 uses the device transformation matrices and the observed magnetic field vectors from the set of magnetic field measurements to minimize an objective function. The objective function as inputs the world magnetic field vector and the device correction vector and computes a loss score based on the inputs and the set of magnetic field measurements. Therefore, by minimizing that objective function, the game server 120 computes an estimate for both the world magnetic field vector and the device correction vector. In some embodiments, the game server 120 minimizes an objective function $f$, where $f$ is defined as:

$$f(v_{World}, v_{Correction}) = \sum_i \|(M_i v_{World} + v_{Correction}) - v_{Observed,i}\|_2$$

where $M_i$ is a device transformation matrix for a magnetic field measurement i. The game server 120 may minimize the objective function by applying an optimization algorithm to the objective function.

While the description above primarily describes a game server 120 performing the steps to compute a device correction vector for a client device 110, some or all of these steps may be performed by the client device 110 itself.

Example Computing System

Figure 4:
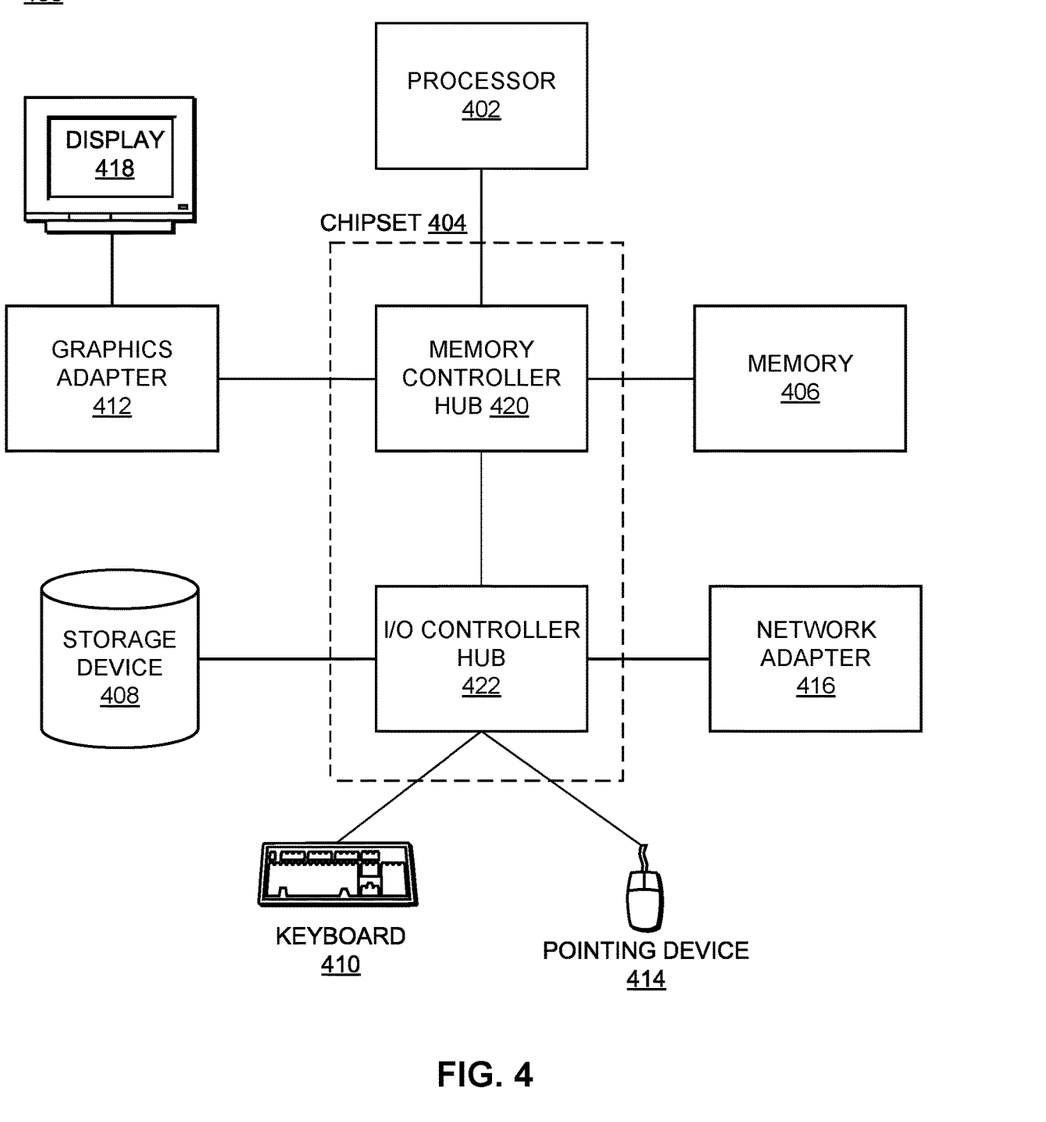
FIG. 4 is an example architecture of a computing device, according to one embodiment.

FIG. 4 is an example architecture of a computing device, in accordance with one or more embodiments. Although FIG. 4 depicts a high-level block diagram illustrating physical components of a computer used as part or all of one or more entities described herein, in accordance with an embodiment, a computer may have additional, less, or variations of the components provided in FIG. 4. Although FIG. 4 depicts a computer 400, the figure is intended as functional description of the various features which may be present in computer systems than as a structural schematic of the implementations described herein. In practice, and as recognized by those of ordinary skill in the art, items shown separately could be combined and some items could be separated.

Illustrated in FIG. 4 are at least one processor 402 coupled to a chipset 404. Also coupled to the chipset 404 are a memory 406, a storage device 408, a keyboard 410, a graphics adapter 412, a pointing device 414, and a network adapter 416. A display 418 is coupled to the graphics adapter 412. In one embodiment, the functionality of the chipset 404 is provided by a memory controller hub 420 and an I/O hub 422. In another embodiment, the memory 406 is coupled directly to the processor 402 instead of the chipset 404. In some embodiments, the computer 400 includes one or more communication buses for interconnecting these components. The one or more communication buses optionally include circuitry (sometimes called a chipset) that interconnects and controls communications between system components.

The storage device 408 is any non-transitory computer-readable storage medium, such as a hard drive, compact disk read-only memory (CD-ROM), DVD, or a solid-state memory device or other optical storage, magnetic cassettes, magnetic tape, magnetic disk storage or other magnetic storage devices, magnetic disk storage devices, optical disk storage devices, flash memory devices, or other non-volatile solid state storage devices. Such a storage device 408 can also be referred to as persistent memory. The pointing device 414 may be a mouse, track ball, or other type of pointing device, and is used in combination with the keyboard 410 to input data into the computer 400. The graphics adapter 412 displays images and other information on the display 418. The network adapter 416 couples the computer 400 to a local or wide area network.

The memory 406 holds instructions and data used by the processor 402. The memory 406 can be non-persistent memory, examples of which include high-speed random-access memory, such as DRAM, SRAM, DDR RAM, ROM, EEPROM, flash memory.

As is known in the art, a computer 400 can have different and/or other components than those shown in FIG. 4. In addition, the computer 400 can lack certain illustrated components. In one embodiment, a computer 400 acting as a server may lack a keyboard 410, pointing device 414, graphics adapter 412, and/or display 418. Moreover, the storage device 408 can be local and/or remote from the computer 400 (such as embodied within a storage area network (SAN)).

As is known in the art, the computer 400 is adapted to execute computer program modules for providing functionality described herein. As used herein, the term "module" refers to computer program logic utilized to provide the specified functionality. Thus, a module can be implemented in hardware, firmware, and/or software. In one embodiment, program modules are stored on the storage device 408, loaded into the memory 406, and executed by the processor 402.

Additional Considerations

Some portions of above description describe the embodiments in terms of algorithmic processes or operations. These algorithmic descriptions and representations are commonly used by those skilled in the data processing arts to convey the substance of their work effectively to others skilled in the art. These operations, while described functionally, computationally, or logically, are understood to be implemented by computer programs comprising instructions for execution by a processor or equivalent electrical circuits, microcode, or the like. Furthermore, it has also proven convenient at times, to refer to these arrangements of functional operations as modules, without loss of generality.

As used herein, any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments. This is done merely for convenience and to give a general sense of the disclosure. This description should be read to include one or at least one and the singular also includes the plural unless it is obvious that it is meant otherwise. Where values are described as "approximate" or "substantially" (or their derivatives), such values should be construed as accurate+/−10% unless another meaning is apparent from the context. From example, "approximately ten" should be understood to mean "in a range from nine to eleven."

Upon reading this disclosure, those of skill in the art will appreciate still additional alternative structural and functional designs for a system and a process for determining a pose of client device. Thus, while particular embodiments and applications have been illustrated and described, it is to be understood that the described subject matter is not limited to the precise construction and components disclosed herein and that various modifications, changes and variations which will be apparent to those skilled in the art may be made in the arrangement, operation and details of the method and apparatus disclosed. The scope of protection should be limited only by the following claims.

What is claimed is:

1. A computer-implemented method comprising:
receiving a set of magnetic field measurements, each magnetic field measurement comprising a device location of a client device, an observed magnetic field vector measured at the device location by a magnetic sensor of the client device, and an orientation of the client device when the magnetic field measurement was captured;
computing a device correction vector for the client device based on the set of magnetic field measurements, wherein the device correction vector is a vector that represents errors in magnetic field vectors measured by the magnetic sensor of the client device, wherein computing the device correction vector comprises, for each magnetic field measurement of the set of magnetic field measurements:
determining a world magnetic field vector at the device location of the magnetic field measurement, wherein the world magnetic field vector is a vector that represents a local magnetic field at the device location, and wherein the world magnetic field vector is in a world reference frame;
computing an expected measured magnetic field vector at the device location based on the world magnetic field vector and the orientation of the client device associated with the magnetic field measurement, wherein the expected measured magnetic field vector is a vector in a device reference frame that represents an expected magnetic field measurement at the device location without the magnetic field errors of the client device;
accessing an estimated device correction vector for the client device;
computing an expected adjusted vector for the client device based on the expected measured magnetic field vector and the estimated device correction vector, wherein the expected adjusted vector is a vector in the device reference frame that represents an expected magnetic field measurement at the device location after adjusting for the magnetic field vector errors of the client device;
comparing the observed magnetic field vector associated with the magnetic field measurement and the expected adjusted vector; and
computing the device correction vector based on the comparison; and
causing calibration of the magnetic sensor of the client device such that a second orientation of the client device is determined by:
subtracting the device correction vector from or summing the device correction vector with a second observed magnetic field vector to compute a corrected magnetic field vector; and
determining the second orientation of the client device using the corrected magnetic field vector.

2. The computer-implemented method of claim 1, wherein computing the expected measured magnetic field vector comprises:
converting the world magnetic field vector from the world reference frame to the device reference frame using a pose estimate of the client device.

3. The computer-implemented method of claim 2, wherein the pose estimate of the client device includes an orientation of the client device in the world reference frame.

4. The computer-implemented method of claim 2, wherein the pose estimate of the client device is determined using visual inertial odometry (VIO) data received from the client device.

5. The computer-implemented method of claim 4, wherein the VIO data comprises captured images and sensor data from the client device associated with a location-based application.

6. The computer-implemented method of claim 4, wherein computing the expected measured magnetic field vector comprises:
grouping the received VIO data and the magnetic field measurements from the client device using bin measurements based on the device location.

7. The computer-implemented method of claim 1, wherein computing the device correction vector comprises:
optimizing the device correction vector; and
obtaining a minimum value corresponding to the estimated device correction vector.

8. The computer-implemented method of claim 1, wherein causing calibration of the magnetic sensor of the client device comprises:
transmitting the device correction vector to the client device, wherein the client device computes the corrected magnetic field vector using the device correction vector.

9. The computer-implemented method of claim 1, further comprising:
receiving an additional set of magnetic field measurements from the client device; and
updating the device correction vector for the client device based on the additional set of magnetic field measurements.

10. A non-transitory computer-readable storage medium comprising instructions executable by a processor, the instructions executable to perform operations comprising:
receiving a set of magnetic field measurements, each magnetic field measurement comprising a device location of a client device, an observed magnetic field vector measured at the device location by a magnetic sensor of the client device, and an orientation of the client device when the magnetic field measurement was captured;
computing a device correction vector for the client device based on the set of magnetic field measurements, wherein the device correction vector is a vector that represents errors in magnetic field vectors measured by the magnetic sensor due to the client device, wherein computing the device correction vector comprises, for each magnetic field measurement of the set of magnetic field measurements:
determining a world magnetic field vector at the device location of the magnetic field measurement, wherein the world magnetic field vector is a vector that represents a local magnetic field at the device location, and wherein the world magnetic field vector is in a world reference frame;
computing an expected measured magnetic field vector at the device location based on the world magnetic field vector and the orientation of the client device associated with the magnetic field measurement, wherein the expected measured magnetic field vector is a vector in a device reference frame that represents an expected magnetic field measurement at the device location without the magnetic field errors of the client device;

accessing an estimated device correction vector for the client device;

computing an expected adjusted vector for the client device based on the expected measured magnetic field vector and the estimated device correction vector, wherein the expected adjusted vector is a vector in the device reference frame that represents an expected magnetic field measurement at the device location after adjusting for the magnetic field errors of the client device;

comparing the observed magnetic field vector associated with the magnetic field measurement and the expected adjusted vector; and computing the device correction vector based on the comparison; and causing calibration of the magnetic sensor of the client device such that a second orientation of the client device is determined by:
  subtracting the device correction vector from or summing the device correction vector with a second observed magnetic field vector to compute a corrected magnetic field vector; and
  determining the second orientation of the client device using the corrected magnetic field vector.

11. The non-transitory computer-readable storage medium of claim 10, wherein computing the expected measured magnetic field vector comprises:
  converting the world magnetic field vector from the world reference frame to the device reference frame using a pose estimate of the client device.

12. The non-transitory computer-readable storage medium of claim 11, wherein the pose estimate of the client device includes an orientation of the client device in the world reference frame.

13. The non-transitory computer-readable storage medium of claim 11, wherein the pose estimate of the client device is determined using visual inertial odometry (VIO) data received from the client device.

14. The non-transitory computer-readable storage medium of claim 13, wherein the VIO data comprises captured images and sensor data from the client device associated with a location-based application.

15. The non-transitory computer-readable storage medium of claim 13, wherein computing the expected measured magnetic field vector comprises:
  grouping the received VIO data and the magnetic field measurements from the client device using bin measurements based on the device location.

16. The non-transitory computer-readable storage medium of claim 10, wherein computing the device correction vector comprises:
  optimizing the device correction vector; and
  obtaining a minimum value as the estimated device correction vector.

17. The non-transitory computer-readable storage medium of claim 10, wherein causing calibration of the magnetic sensor of the client device comprises:
  transmitting the device correction vector to the client device, wherein the client device computes the corrected magnetic field vector using the device correction vector.

18. The non-transitory computer-readable storage medium of claim 10, wherein the operations further comprise:
  receiving an additional set of magnetic field measurements from the client device; and
  updating the device correction vector for the client device based on the additional set of magnetic field measurements.

19. A computer system comprising:
  at least one processor; and
  a non-transitory computer readable medium comprising stored instructions, the instructions when executed by the at least one processor cause the at least one processor to:
    receive a set of magnetic field measurements, each magnetic field measurement comprising a device location of a client device, an observed magnetic field vector measured at the device location by a magnetic sensor of the client device, and an orientation of the client device when the magnetic field measurement was captured;
    compute a device correction vector for the client device based on the set of magnetic field measurements, wherein the device correction vector is a vector that represents errors in magnetic field vectors measured by the magnetic sensor due the client device, wherein computing the device correction vector comprises, for each magnetic field measurement of the set of magnetic field measurements:
      determining a world magnetic field vector at the device location of the magnetic field measurement, wherein the world magnetic field vector is a vector that represents a local magnetic field at the device location, and wherein the world magnetic field vector is in a world reference frame;
      computing an expected measured magnetic field vector at the device location based on the world magnetic field vector and the orientation of the client device associated with the magnetic field measurement, wherein the expected measured magnetic field vector is a vector in a device reference frame that represents an expected magnetic field measurement at the device location without the magnetic field errors of the client device;
      accessing an estimated device correction vector for the client device;
      computing an expected adjusted vector for the client device based on the expected measured magnetic field vector and the estimated device correction vector, wherein the expected adjusted vector is a vector in the device reference frame that represents an expected magnetic field measurement at the device location after adjusting for the magnetic field errors of the client device;
      comparing the observed magnetic field vector associated with the magnetic field measurement and the expected adjusted vector; and
      computing the device correction vector based on the comparison; and
    cause calibration of the magnetic sensor of the client device such that a second orientation of the client device is determined by:
      subtracting the device correction vector from or summing the device correction vector with a second observed magnetic field vector to compute a corrected magnetic field vector; and determining the second orientation of the client device using the corrected magnetic field vector.

20. The computer system of claim 19, wherein the instructions to cause calibration of the magnetic sensor of the client device, when executed by the at least one processor further cause the at least one processor to:
transmit the device correction vector to the client device, wherein the client device computes the corrected magnetic field vector using the device correction vector.

* * * * *